US009811621B2

(12) United States Patent
Bozman et al.

(10) Patent No.: US 9,811,621 B2
(45) Date of Patent: Nov. 7, 2017

(54) IMPLEMENTING INTEGRATED CIRCUIT DESIGNS USING DEPOPULATION AND REPOPULATION OPERATIONS

(71) Applicant: Altera Corporation, San Jose, CA (US)

(72) Inventors: Kimberly Anne Bozman, Surrey (CA); David Ian Milton, Oshawa (CA); Nishanth Sinnadurai, Scarborough (CA)

(73) Assignee: Altera Corporation, San Jose, CA (US)

( * ) Notice: Subject to any disclaimer, the term of this patent is extended or adjusted under 35 U.S.C. 154(b) by 94 days.

(21) Appl. No.: 14/702,627

(22) Filed: May 1, 2015

(65) Prior Publication Data

US 2016/0321390 A1   Nov. 3, 2016

(51) Int. Cl.
*G06F 17/50* (2006.01)
(52) U.S. Cl.
CPC .................. *G06F 17/505* (2013.01)
(58) Field of Classification Search
CPC ...................................... G06F 17/50
USPC ........................................... 716/126
See application file for complete search history.

(56) References Cited

U.S. PATENT DOCUMENTS

| 4,110,697 | A | 8/1978 | Wilcox |
| 6,804,812 | B2 | 10/2004 | Osann, Jr. et al. |
| 6,874,135 | B2 | 3/2005 | Gupta et al. |
| 7,055,125 | B2 | 5/2006 | Osann, Jr. et al. |
| 7,120,883 | B1 | 10/2006 | van Antwerpen et al. |
| 8,387,050 | B2 | 2/2013 | Do et al. |
| 8,677,298 | B1 | 3/2014 | Manoharrarajah et al. |
| 8,863,059 | B1 | 10/2014 | Fung et al. |
| 8,898,667 | B2 | 11/2014 | Do et al. |
| 8,918,748 | B1 | 12/2014 | Chiu et al. |
| 2012/0089812 | A1* | 4/2012 | Smith ............... G06F 9/4843 712/21 |

OTHER PUBLICATIONS

Mike Hutton: "WP-01231-1.0: Understanding How the New HyperFlex Architecture Enables Next-Generation High-Performance Systems", Apr. 30, 2015 (Apr. 30, 2015), pp. 1-11, Retrieved from the Internet: URL:https://www.altera.com/en_US/pdfs/literature/wp/wp-01231-understanding-hot-hyperflex-architecture-enables-high-performance-systems.pdf [retrieved on Jul. 28, 2016].

* cited by examiner

*Primary Examiner* — Thuan Do
(74) *Attorney, Agent, or Firm* — Jason Tsai

(57) ABSTRACT

Circuit design computing equipment may perform depopulation operations, constraint generation, and repopulation operations in a circuit design in anticipation of register retiming operations. A depopulation operation before placement and/or before routing operations may prevent the respective placement and/or routing operations from placing and/or routing registers from the circuit design. Constraint generation may create constraints for placement and/or routing operations that allow for the reinsertion of registers after routing operations. Repopulation operations may reinsert registers in the circuit design after routing operations according to the constraints. If desired, the circuit design computing equipment may perform register retiming operations to further improve the performance of the circuit design.

14 Claims, 14 Drawing Sheets

IMPLEMENTING INTEGRATED CIRCUIT DESIGNS USING DEPOPULATION AND REPOPULATION OPERATIONS

BACKGROUND

This relates to integrated circuits and, more particularly, to performing depopulation and repopulation operations during implementation of an integrated circuit design.

Every transition from one technology node to the next technology node has resulted in smaller transistor geometries and thus potentially more functionality implemented per unit of integrated circuit area. Synchronous integrated circuits have further benefited from this development as evidenced by reduced interconnect and cell delays, which have led to performance increases.

To further increase the performance, solutions such as register retiming have been proposed, where registers are moved among portions of combinational logic, thereby achieving a more balanced distribution of delays between registers and thus potentially a higher clock frequency at which the integrated circuit may be operated.

However, performing register retiming before placement operations is based on an estimation of anticipated delays (i.e., the estimation is based on the number of combinational logic gates between registers in the pre-placement circuit design) and may lead to suboptimal register retiming solutions in terms of actual delays between registers.

Similarly, performing register retiming before routing operations is based on an estimation of anticipated delays (i.e., the estimation is based on the Manhattan distance between registers in the placed circuit design) and may lead to suboptimal register retiming solutions in terms of actual delays between registers caused by longer routes due to routing blockages.

Performing register retiming after placement or after routing operations may require an update of the previously determined placement solution or the previously determined placement and routing solution, respectively.

SUMMARY

In accordance with certain aspects of the invention, a circuit design computing equipment may receive a circuit design description that includes a register coupled between first and second circuit design elements. The circuit design computing equipment may perform a depopulation operation that prevents a routing operation from connecting the register and perform the routing operation that connects the first and second circuit design elements using a pipelined routing resource that is configured to operate in non-pipeline mode. The circuit design computing equipment may perform a repopulation operation that changes the configuration of the pipelined routing resource from operating in non-pipeline mode to operating in pipeline register mode.

It is appreciated that the present invention can be implemented in numerous ways, such as a process, an apparatus, a system, a device, or a method on a computer readable medium. Several inventive embodiments of the present invention are described below.

In certain embodiments, the above-mentioned circuit design computing equipment may perform a register retiming operation that configures the pipelined routing resource to operate in non-pipeline mode. If desired, the circuit design computing equipment may perform the register retiming operation by changing the configuration of an additional pipelined routing resource from operating in non-pipeline mode to operating in pipeline register mode.

In some embodiments, the additional pipelined routing resource may be connected to an output of the second circuit design element. In other embodiments, the additional pipelined routing resource may be connected to an input of the first circuit design element.

Further features of the invention, its nature and various advantages, will be more apparent from the accompanying drawings and the following detailed description of the preferred embodiments.

DETAILED DESCRIPTION

The present embodiments relate to integrated circuits and, more particularly, to performing depopulation and repopulation operations during the implementation of an integrated circuit design.

As mentioned above in the Background section, performing register retiming before placement operations and/or before routing operations is based on an estimation of anticipated delays and may lead to suboptimal register retiming solutions in terms of actual delays between registers. However, performing register retiming after placement or after routing operations may require an update of the previously determined placement solution or the previously determined placement and routing solution, respectively.

It may therefore be desirable to anticipate potential register retiming operations before placement operations and/or before routing operations by performing depopulation operations (e.g., by eliminating registers from the circuit design that may be moved during register retiming operations) and to perform the actual register retiming operation after the completion of the routing operation by performing repopulation operations (e.g., by inserting previously eliminated registers into the routed circuit design).

It will be recognized by one skilled in the art, that the present exemplary embodiments may be practiced without some or all of these specific details. In other instances, well-known operations have not been described in detail in order not to unnecessarily obscure the present embodiments.

Figure 1:
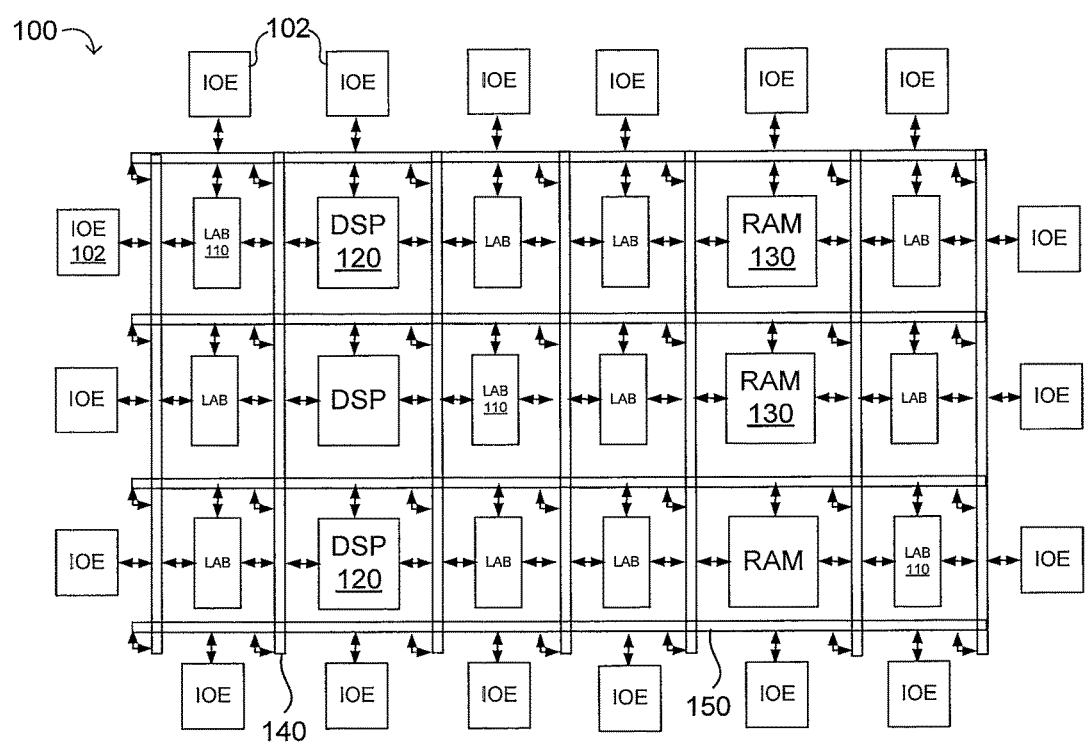
FIG. 1 is a diagram of an illustrative integrated circuit in accordance with an embodiment.

An illustrative embodiment of an integrated circuit such as programmable logic device (PLD) 100 that may be configured to implement a circuit design is shown in FIG. 1. As shown in FIG. 1, the programmable logic device (PLD) may include a two-dimensional array of functional blocks, including logic array blocks (LABs) 110 and other functional blocks, such as random access memory (RAM) 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

Programmable logic device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

In addition, the programmable logic device may have input/output elements (IOEs) 102 for driving signals off of PLD and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include pipeline elements, and the contents stored in these pipeline elements may be accessed during operation. For example, a programming circuit may provide read and write access to a pipeline element.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
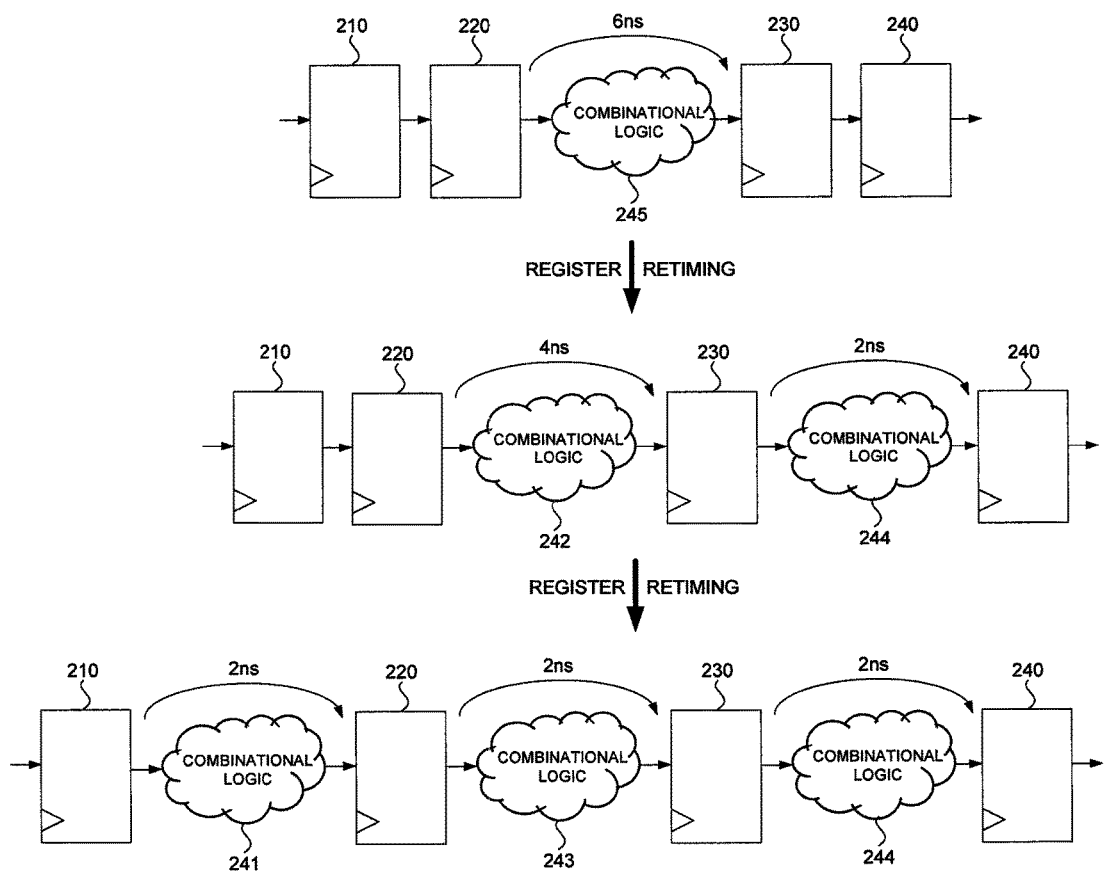
FIG. 2 is a diagram of illustrative register retiming operations in accordance with an embodiment.

FIG. 2 shows an example of different versions of a circuit design that PLD 100 may implement. The first version of the circuit design may include clocked storage circuits such as registers 210, 220, 230, and 240 and combinational logic 245.

Combinational logic 245 may include any digital logic that is implemented by Boolean circuits, whose outputs may asynchronously change as a function of only the present inputs. Examples of combinational logic may include AND, OR, NAND, NOR, and XOR logic gates, inverters, pass gates, multiplexers, demultiplexers, look-up tables, logic arrays, etc. and any combination thereof.

In contrast, sequential logic may include any digital logic that is implemented by circuits, whose outputs may synchronously change at discrete times in response to a synchronization signal (e.g., a clock signal). Examples of sequential logic may include any clocked storage circuits such as registers (sometimes referred to as flip-flops) or memories such as random-access memory (RAM), read-only memory (ROM), content-addressable memory (CAM), etc.

A circuit design element may include any combinational logic, sequential logic and/or wire in a circuit design. If desired, a delay may be associated with a circuit design element.

In the example of FIG. 2, register 210 may send a signal to register 220; register 220 may send the signal through combinational logic 240 to register 230; and register 230 may send the signal to register 240. As an example, the path from register 220 through combinational logic 245 to register 230 may have a delay of 6 ns (nanoseconds), whereas the path between registers 210 and 220 and between registers 230 and 240 may have a negligible delay of zero nanoseconds. Thus, the first version of the circuit design may operate at a frequency of 166 MHz.

Performing register retiming on the first version of the circuit design may create the second version of the circuit design. For example, register 230 may be pushed back through a portion of combinational logic 245, thereby separating combinational logic 245 of the first version of the circuit design into combinational logic 242 and 244 of the second version of the circuit design. In the second version of the circuit design, register 210 may send a signal to register 220; register 220 may send the signal through combinational logic 242 to register 230; and register 230 may send the signal through combinational logic 244 to register 240.

As an example, the path from register 220 through combinational logic 242 to register 230 may have a delay of 4 ns, and the path from register 230 through combinational logic 244 to register 240 may have a delay of 2 ns. Thus, the second version of the circuit design may operate at a frequency of 250 MHz.

Performing register retiming on the second version of the circuit design may create the third version of the circuit design. For example, register 220 may be pushed forward through a portion of combinational logic 242, thereby separating combinational logic 242 of the second version of the circuit design into combinational logic 241 and 243 of the third version of the circuit design. In the third version of the circuit design, register 210 may send a signal through combinational logic 241 to register 220; register 220 may send the signal through combinational logic 243 to register 230; and register 230 may send the signal through combinational logic 244 to register 240.

As an example, the paths from register 210 through combinational logic 241 to register 220, from register 220 through combinational logic 243 to register 230, and from register 230 through combinational logic 244 to register 240 may all have a delay of 2 ns. Thus, the third version of the circuit design may operate at a frequency of 500 MHz, which is thrice the frequency at which the first version of the circuit design may operate.

In some embodiments, registers may be pushed along a wire without being pushed forward or backward through combinational logic. For example, consider the scenario in which the wire from register 220 to combinational logic 242 of the second version of the circuit design has a delay of 2 ns and the path through combinational logic 242 to register 230 a delay of 2 ns. In this scenario, register 220 may be pushed along the wire closer to combinational logic 242, thereby achieving the same result (i.e., a worst case delay of 2 ns between registers 210, 220, 230, and 240) as in the third version of the circuit design without pushing register 220 through any combinational logic.

Thus, in order not to unnecessarily obscure the present embodiments, we refer to all register moves, including pushing a register forward or backward through combinational logic and pushing a register forward or backward along a wire, as a register retiming operation.

Figure 3:
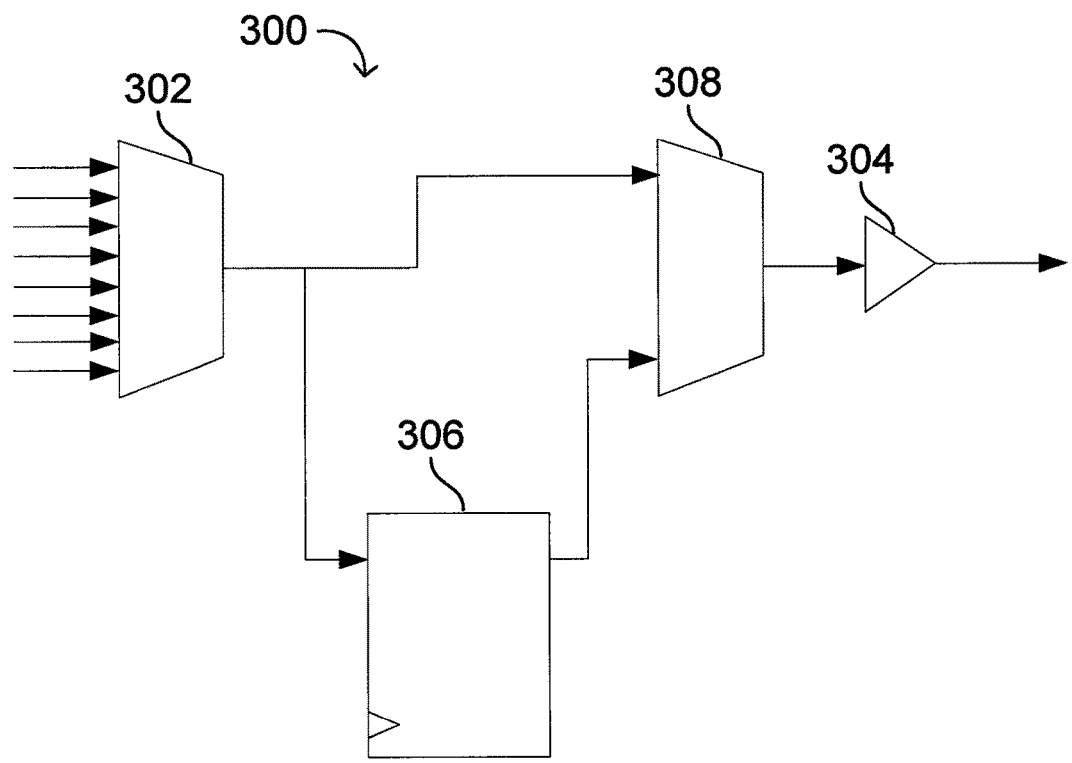
FIG. 3 is a diagram of an illustrative pipelined routing resource which uses a register to pipeline a routing signal in accordance with an embodiment.

If desired, routing resources such as the vertical routing channels 140 or the horizontal routing channels 150 of FIG. 1 may include pipeline elements, which can facilitate register retiming. FIG. 3 depicts a pipelined routing resource 300 which uses a register in accordance with an embodiment. As shown, the pipelined routing resource 300 includes a first multiplexer 302, a driver 304, a register 306, and a second multiplexer 308.

Multiplexer 302 may be a driver input multiplexer (DIM) or a functional block input multiplexer (FBIM). A DIM may select a signal from multiple sources and send the selected signal to driver 304 that drives the wire. The multiple sources may include signals from outputs of functional blocks and other routing wires that travel in the same or in an orthogonal direction to the wire. A FBIM outputs a signal to a functional block and may select the signal from multiple routing wires.

As shown in FIG. 3, in accordance with an embodiment of the invention, the multiplexer 302 may be pipelined by providing its output to the data input of register 306. Multiplexer 308 in the pipelined routing resource 300 may receive the output of multiplexer 302 directly and may also receive the data output from register 306.

Although the pipelined routing resource 300 includes a register, it will be recognized by one skilled in the art that different register implementations may be used to store a routing signal such as an edge-triggered flip-flop, a pulse latch, a transparent-low latch, a transparent-high latch, just to name a few. Thus, in order not to unnecessarily obscure the present embodiments, we refer to the storage circuit in the pipelined routing resource as a pipeline storage element.

Multiplexer 308 may enable the pipelined routing resource 300 to be either used in a non-pipeline mode or in a pipeline register mode. In the non-pipeline mode, the output of multiplexer 308 selects the direct output of multiplexer 302.

In the pipeline register mode, multiplexer 308 may select the output of register 306. Multiplexer 308 may provide its output to driver circuit 304, and the output of driver circuit 304 may be used to drive a routing wire. The routing wire may span multiple functional blocks (e.g., for a pipelined routing resource with a DIM). Alternatively, the routing wire may be inside a functional block (e.g., for a pipelined routing resource with a FBIM).

Every DIM/FBIM may include a register such as register 306 such that all the routing multiplexers are pipelined. However, in some embodiments, that may be unnecessary as the capabilities provided may exceed design requirements. Thus, in certain embodiments only a fraction, such as one-half or one-fourth, of the routing multiplexers may be pipelined. For example, a signal may take 150 picoseconds (ps) to traverse a wire of a given length, but a clock signal may be constrained to operate with a 650 ps clock cycle. Thus, providing a pipeline register such as register 306 every fourth wire may be sufficient in this example. Alternatively the registers may be placed more frequently than every fourth wire (e.g., every second wire) to provide a higher degree of freedom in selection of which registers are used.

Pipelined routing resources such as pipelined routing resource 300 may facilitate register retiming operations, such as the register retiming illustrated in FIG. 2. For example, consider the scenario in which register 230 is implemented by a first instance of a pipelined routing element that is operated in pipeline register mode (i.e., register 230 is implemented by register 306 of a first instance of a pipelined routing resource 300). Consider further that the path from register 220 through combinational logic 245 to register 230 includes a second instance of a pipelined routing element that is operated in non-pipeline mode. Thus, switching the first instance of the pipelined routing element from operating in pipeline register mode to operating in non-pipeline mode and switching the second instance of the pipelined routing element from operating in non-pipeline mode to operating in pipeline register mode may transform the first version into the second version of the circuit design presented in FIG. 2.

CAD tools in a circuit design system may evaluate whether register retiming may improve the performance of a current version of a circuit design or whether the current version of the circuit design meets a given performance criterion. If desired, and in the event that the CAD tools determine that register retiming would improve the performance of the current version of the circuit design or that the current version of the circuit design misses the given performance criterion, the CAD tools may execute register retiming operations that transform the current version of the circuit design into another version of the circuit design (e.g., as illustrated in FIG. 2).

Figure 4:
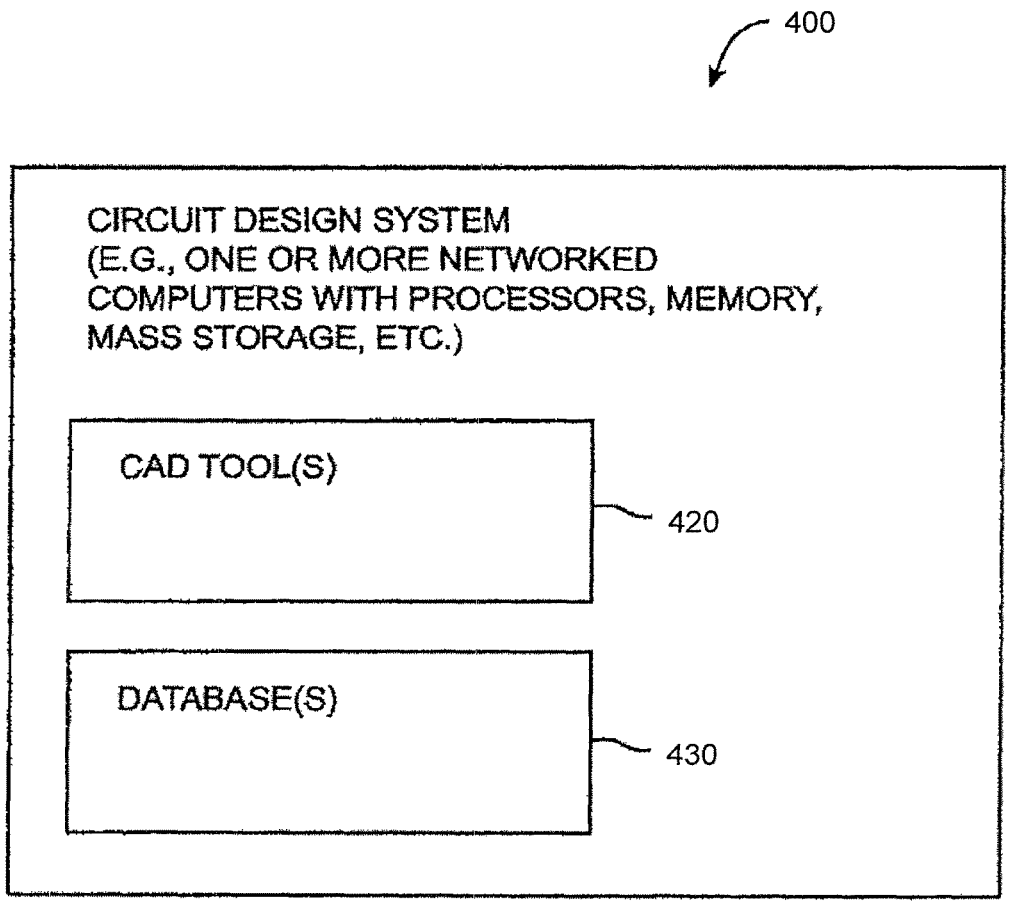
FIG. 4 is a diagram of an illustrative circuit design system that may be used to design integrated circuits in accordance with an embodiment.

An illustrative circuit design system 400 in accordance with an embodiment is shown in FIG. 4. System 400 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 420 and databases 430 reside on system 400. During operation, executable software such as the software of computer aided design tools 420 runs on the processor(s) of system 400. Databases 430 are used to store data for the operation of system 400. In general, software and data may be stored on any computer-readable medium (storage) in system 400. Such storage may include computer memory chips, removable and fixed media such as hard disk drives, flash memory, compact discs (CDs), digital versatile discs (DVDs), blu-ray discs (BDs), other optical media, floppy diskettes, tapes, or any other suitable memory or storage device(s). When the software of system 400 is installed, the storage of system 400 has instructions and data that cause the computing equipment in system 400 to execute various methods (processes). When performing these processes, the computing equipment is configured to implement the functions of the circuit design system.

The computer aided design (CAD) tools 420, some or all of which are sometimes referred to collectively as a CAD tool, as an electronic design automation (EDA) tool, or as circuit design computing equipment may be provided by a single vendor or by multiple vendors. Tools 420 may be provided as one or more suites of tools (e.g., a compiler suite for performing tasks associated with implementing a circuit design in a programmable logic device) and/or as one or more separate software components (tools). Database(s) 430 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 5:
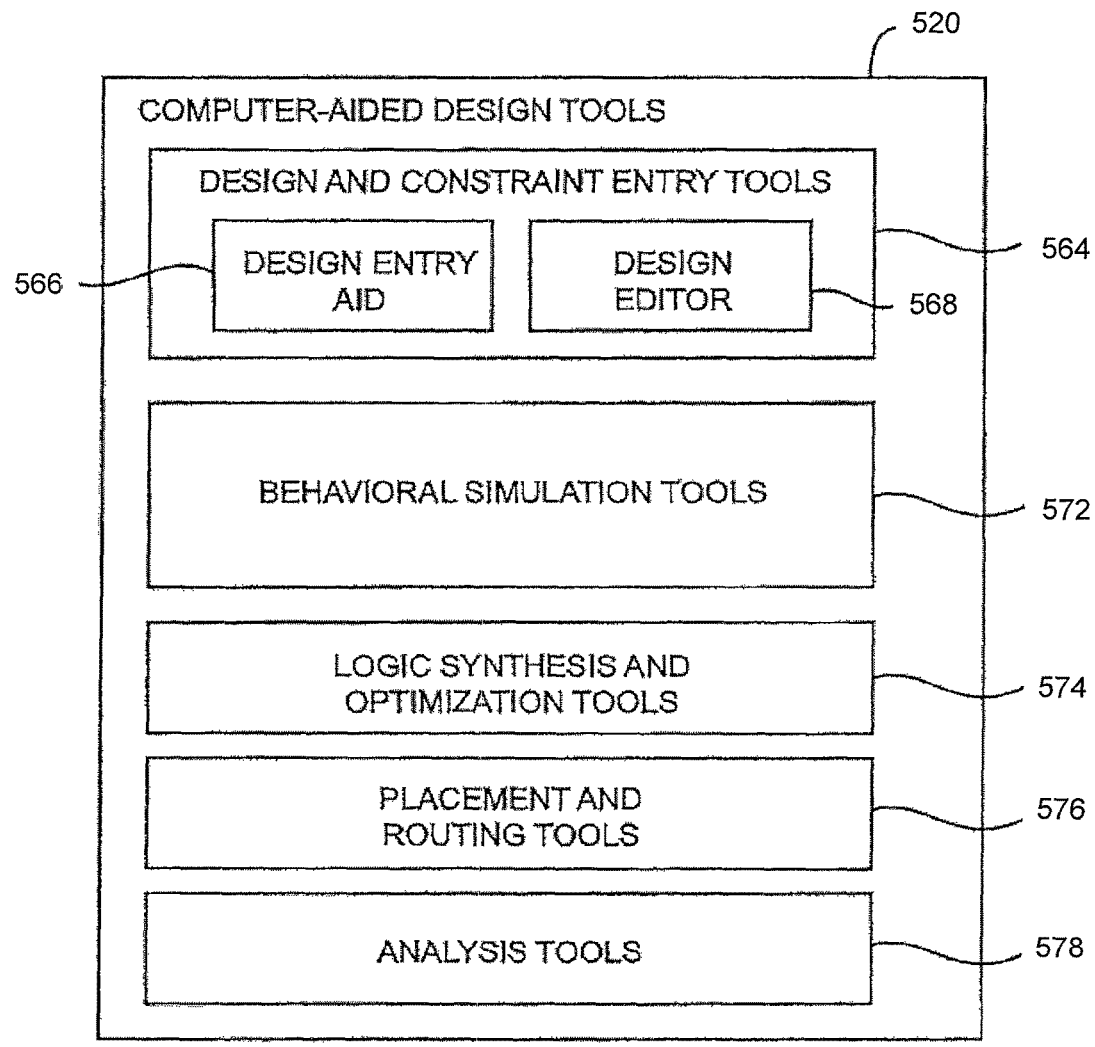
FIG. 5 is a diagram of illustrative computer-aided design (CAD) tools that may be used in a circuit design system in accordance with an embodiment.

Illustrative computer aided design tools 520 that may be used in a circuit design system such as circuit design system 400 of FIG. 4 are shown in FIG. 5.

The design process may start with the formulation of functional specifications of the integrated circuit design (e.g., a functional or behavioral description of the integrated circuit design). A circuit designer may specify the functional operation of a desired circuit design using design and constraint entry tools 564. Design and constraint entry tools 564 may include tools such as design and constraint entry aid 566 and design editor 568. Design and constraint entry aids such as aid 566 may be used to help a circuit designer locate a desired design from a library of existing circuit designs and may provide computer-aided assistance to the circuit designer for entering (specifying) the desired circuit design.

As an example, design and constraint entry aid 566 may be used to present screens of options for a user. The user may click on on-screen options to select whether the circuit being designed should have certain features. Design editor 568 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 564 may be used to allow a circuit designer to provide a desired circuit design using any suitable format. For example, design and constraint entry tools 564 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 564 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 564 may allow the circuit designer to provide a circuit design to the circuit design system 400 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 568. Blocks of code may be imported from user-maintained or commercial libraries if desired.

After the design has been entered using design and constraint entry tools 564, behavioral simulation tools 572 may be used to simulate the functional performance of the circuit design. If the functional performance of the design is incomplete or incorrect, the circuit designer can make changes to the circuit design using design and constraint entry tools 564. The functional operation of the new circuit design may be verified using behavioral simulation tools 572 before synthesis operations have been performed using tools 574. Simulation tools such as behavioral simulation tools 572 may also be used at other stages in the design flow if desired (e.g., after logic synthesis). The output of the behavioral simulation tools 572 may be provided to the circuit designer in any suitable format (e.g., truth tables, timing diagrams, etc.).

Once the functional operation of the circuit design has been determined to be satisfactory, logic synthesis and optimization tools 574 may generate a gate-level netlist of the circuit design, for example using gates from a particular library pertaining to a targeted process supported by a foundry, which has been selected to produce the integrated circuit. Alternatively, logic synthesis and optimization tools 574 may generate a gate-level netlist of the circuit design using gates of a targeted programmable logic device (i.e., in the logic and interconnect resources of a particular programmable logic device product or product family).

Logic synthesis and optimization tools 574 may optimize the design by making appropriate selections of hardware to implement different logic functions in the circuit design based on the circuit design data and constraint data entered by the logic designer using tools 564.

After logic synthesis and optimization using tools 574, the circuit design system may use tools such as placement and routing tools 576 to perform physical design steps (layout synthesis operations). Placement and routing tools 576 are used to determine where to place each gate of the gate-level netlist produced by tools 574. For example, if two counters interact with each other, the placement and routing tools 576 may locate these counters in adjacent regions to reduce interconnect delays or to satisfy timing requirements specifying the maximum permitted interconnect delay. The placement and routing tools 576 create orderly and efficient implementations of circuit designs for any targeted integrated circuit (e.g., for a given programmable integrated circuit such as a field-programmable gate array (FPGA).)

Tools such as tools 574 and 576 may be part of a compiler suite (e.g., part of a suite of compiler tools provided by a programmable logic device vendor). In accordance with the present invention, tools such as tools 574, 576, and 578 may also include timing analysis tools such as timing estimators. This allows tools 574 and 576 to satisfy performance requirements (e.g., timing requirements) before actually producing the integrated circuit.

As an example, tools 574 and/or 576 may perform register retiming operations on the circuit design based on the length of a combinational path between registers in the circuit design and corresponding timing constraints that were entered by the logic designer using tools 564. The register retiming operations may move registers through combinational logic (e.g., through logical AND, OR, XOR, etc. gates, look-up tables (LUTs), multiplexers, arithmetic operators, etc.) or along wires as described in FIG. 2. If desired, tools 574 and 576 may perform forward and backward pushes of registers by configuring pipelined routing resources such as pipelined routing resource 300 of FIG. 3 to operate in non-pipeline mode or in pipeline register mode.

In some embodiments, tools 574 and/or 576 may anticipate potential register retiming operations. For this purpose, tools 574 and/or 576 may perform a depopulation operation, which may eliminate the candidate registers, thereby preventing subsequent placement and/or routing operations from placing the candidate registers and/or connecting the candidate registers. For example, the depopulation operation may remove the candidate register from the circuit design. If desired, the depopulation operation may label or otherwise mark the candidate register accordingly. Tools 574 and/or 576 may perform placement and routing operations without placing or routing registers that were previously eliminated during the depopulation operation. After placement and routing operations, tools 576 may perform repopulation operations, which may insert the previously eliminated candidate registers into the placed and routed netlist by configuring pipelined routing resources such as pipelined routing resource 300 of FIG. 3 to operate in pipeline register mode.

After an implementation of the desired circuit design has been generated using placement and routing tools 576, the implementation of the design may be analyzed and tested using analysis tools 578. For example, analysis tools 578 may include timing analysis tools, power analysis tools, or formal verification tools, just to name few.

After satisfactory optimization operations have been completed using tools 520 and depending on the targeted integrated circuit technology, tools 520 may produce a mask-level layout description of the integrated circuit or configuration data for programming the programmable logic device.

Figure 6:
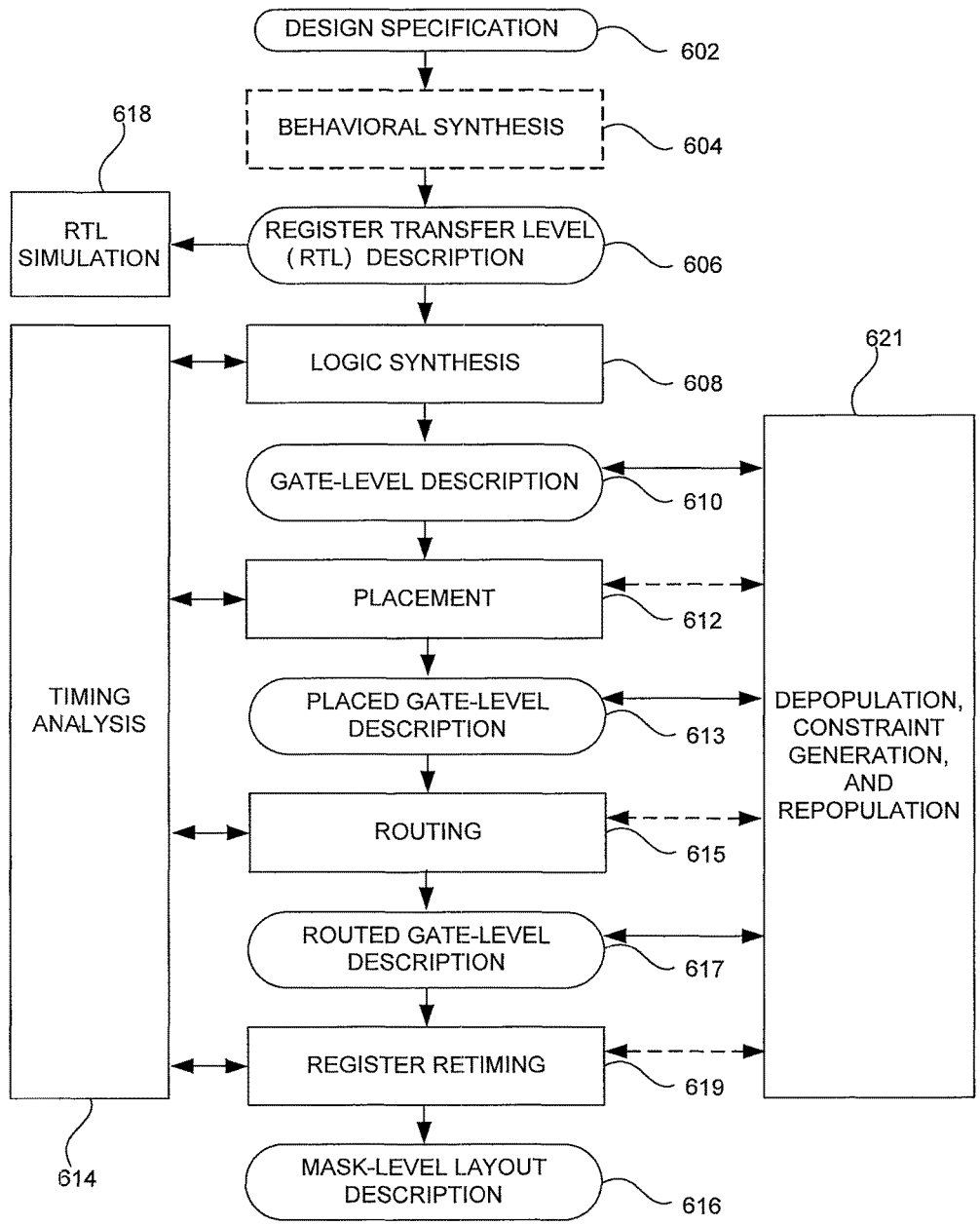
FIG. 6 is a flow chart of illustrative steps for designing an integrated circuit in accordance with an embodiment.

Illustrative operations involved in using tools 520 of FIG. 5 to produce the mask-level layout description of the integrated circuit are shown in FIG. 6. As shown in FIG. 6, a circuit designer may first provide a design specification 602. The design specification 602 may, in general, be a behavioral description provided in the form of an application code (e.g., C code, C++ code, SystemC code, OpenCL code, etc.). In some scenarios, the design specification may be provided in the form of a register transfer level (RTL) description 606.

In general, the behavioral design specification 602 may include untimed or partially timed functional code (i.e., the application code does not describe cycle-by-cycle hardware behavior), whereas the RTL description 606 may include a fully timed design description that details the cycle-by-cycle behavior of the circuit at the register transfer level.

At step 604, behavioral synthesis (sometimes also referred to as algorithmic synthesis) may be performed to convert the behavioral description into an RTL description 606. Step 604 may be skipped if the design specification is already provided in form of an RTL description.

The RTL description may have any form of describing circuit functions at the register transfer level. For example, the RTL description may be provided using a hardware description language such as the Verilog hardware description language (Verilog HDL or Verilog), the SystemVerilog hardware description language (SystemVerilog HDL or SystemVerilog), or the Very High Speed Integrated Circuit Hardware Description Language (VHDL). If desired, a portion or all of the RTL description may be provided as a schematic representation.

Design specification 602 or RTL description 606 may also include target criteria such as area use, power consumption, delay minimization, clock frequency optimization, or any combination thereof. The optimization constraints and target criteria may be collectively referred to as constraints.

Those constraints can be provided for individual data paths, portions of individual data paths, portions of a design, or for the entire design. For example, the constraints may be provided with the design specification 602, the RTL description 606 (e.g., as a pragma or as an assertion), in a constraint file, or through user input (e.g., using the design and constraint entry tools 564 of FIG. 5), to name a few.

In certain embodiments, a given data path may have more than one constraint associated with the path, and some of these constraints may be in conflict with each other (e.g., a constraint received with the behavioral design specification for a given path may conflict with the constraint received with the RTL description and with a constraint received with a constraint file). In this scenario, a predetermined priority of constraints, which may be defined explicitly or resolved implicitly by CAD tools 520, may determine which of the conflicting constraints is selected. For example, the constraint from the user or a configuration file may override the constraints received from other sources, whereas a constraint received with the RTL description may override a constraint received with the behavioral design specification.

The constraints may target the entire circuit design or portions of the circuit design. For example, some constraints may be defined globally and thus be applicable to the entire circuit design. Other constraints may be assigned locally and thus be applicable only to the corresponding portions of the circuit design.

Consider the scenario in which the circuit design is organized hierarchically. In this scenario, every hierarchical instance may include different assignments. In other words, multiple different constraints may target the same portion of the circuit design, and priorities may be defined explicitly or resolved implicitly by CAD tools 520. For example, a constraint defined at a higher level of the design hierarchy may override a constraint at a lower level. Alternatively, a constraint defined at a lower level of the design hierarchy may override a constraint at a higher level, or individual levels of the design hierarchy may be given priority over other levels of design hierarchy.

Constraints included in design specification 602 or RTL description 606 may be conveyed to CAD tools 520 in the form of variables, parameters, compiler directives, macros, pragmas, or assertions, just to name a few. CAD tools 520 may use a constraint file, which may include a portion or all of the constraints. Such a constraint file may be included with design specification 602 or RTL description 606. In some scenarios, a portion or all of the constraints may be embedded in the circuit design. Alternatively, the constraints may have been defined using the design and constraint entry tools 564 (see FIG. 5).

At step 618, behavioral simulation tools 572 may perform an RTL simulation of the RTL description, which may verify the functional performance of the RTL description. If the functional performance of the RTL description is incomplete or incorrect, the circuit designer can make changes to the HDL code (as an example). During RTL simulation 618, actual results obtained from simulating the behavior of the RTL description may be compared with expected results.

During step 608, logic synthesis operations may generate gate-level description 610 using logic synthesis and optimization tools 574 from FIG. 5. If desired, logic synthesis operations may perform register retiming as illustrated in FIG. 2 according to the constraints that are included in design specification 602 or RTL description 606. The output of logic synthesis 608 is gate-level description 610.

During step 612, placement operations using for example placement and routing tools 576 of FIG. 5 may place the different gates in gate-level description 610 in a preferred location on the targeted integrated circuit to meet given target criteria (e.g., minimize area and maximize routing efficiency or minimize path delay and maximize clock frequency or any combination thereof). The output of placement 612 is placed gate-level description 613.

During step 615, routing operations using for example placement and routing tools 576 of FIG. 5 may connect the gates from the placed gate-level description 613. Routing operations may attempt to meet given target criteria (e.g., minimize congestion, minimize path delay and maximize clock frequency or any combination thereof). The output of routing 615 is routed gate-level description 617.

During step 619, register retiming operations using for example placement and routing tools 576 of FIG. 5 may move registers in the routed gate-level description 617 as illustrated in FIG. 2 and according to the constraints that are included in design specification 602 or RTL description 606. As an example, register retiming operations may change the configuration of some pipelined routing resources (e.g., some instances of pipelined routing resource 300 of FIG. 3) from operating in pipeline register mode to operating in non-pipelined mode and the configuration of other pipelined routing resources (e.g., other instances of pipelined routing resources 300 of FIG. 3) from operating in non-pipelined mode to operating in pipeline register mode. The output of register retiming 619 is a mask-level layout description 616.

Circuit design system 400 (FIG. 4) may include a timing estimator (e.g., formed as part of optimization tools 574, tools 576, or tools 578) that may be used to estimate delays between synchronous elements of the circuit design during step 614. For example, the timing estimator may estimate delays between clocked storage elements such as registers and storage circuits (e.g., based on the lengths of interconnects, intermediate combinational logic, etc.). If desired, the steps logic synthesis 608, placement 612, routing 615, and register retiming 619 may invoke timing analysis 614 to estimate delays between clocked storage elements during the respective steps.

The delays may, if desired, be estimated based on metrics such as slack (e.g., the difference between a required arrival time and the arrival time of a signal), slack-ratios, interconnect congestion, or other timing metrics. Circuit design system 400 may use the estimated delays to determine the locations of groups of circuitry while helping to ensure that delays satisfy timing requirements (e.g., critical path delay requirements) or other performance constraints.

Consider the scenario in which a circuit design has a given path from a register through combinational logic to another register and that this given path misses one or more target criteria. The timing estimator may further determine that the given path is associated with a delay that is larger than the target delay specified for the path as one of the target criteria. For example, the timing estimator may detect that the given path has a delay that is larger than the target delay after routing 615. In this scenario, register retiming 619 may move registers (e.g., forward and/or backward through combinational logic and/or along wires), thereby reducing the delay between the registers and potentially improving the performance of the given path.

During step 621, depopulation, constraint generation, and repopulation operations using for example placement and routing tools 576 of FIG. 5 may anticipate potential register retiming operations before placement operations and/or before routing operations by performing depopulation operations (e.g., by removing registers from the circuit design or by labeling registers in the circuit design that may be moved during register retiming operations accordingly) and to perform the actual register retiming operation after the completion of the routing operation by performing repopulation operations (e.g., by inserting previously eliminated registers into the routed circuit design during register retiming operations). Depopulation, constraint generation, and repopulation operations 621 may be invoked by placement 612, routing 615, and/or register retiming 619, operate directly on gate-level description 610, placed gate-level description 613, and/or routed gate-level description 617, or a combination thereof.

Figure 7:
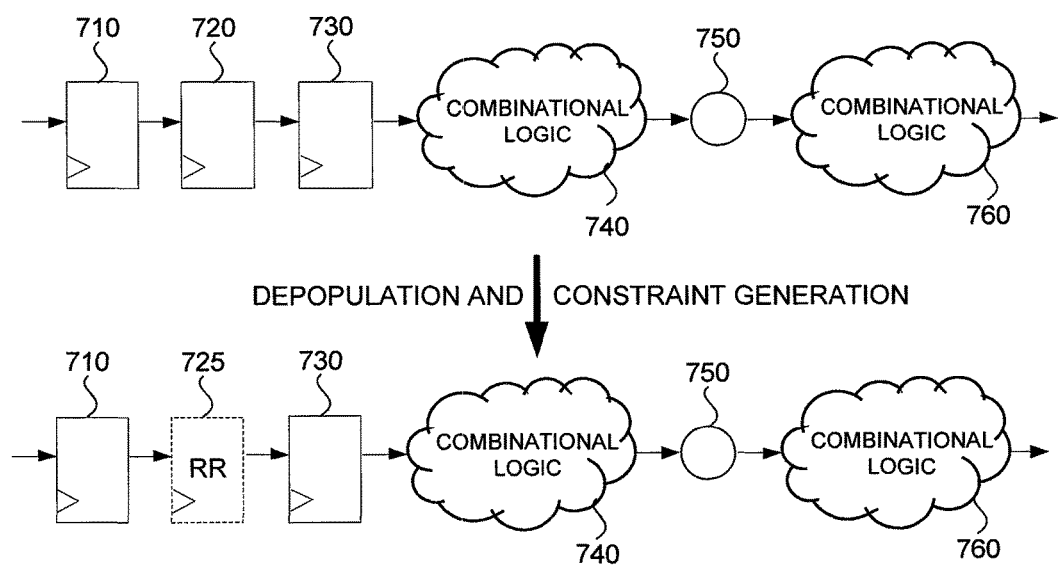
FIG. 7 is a diagram of an illustrative depopulation and constraint generation operation before placement operations in accordance with an embodiment.

FIG. 7 shows an illustrative depopulation and constraint generation operation before placement operations in accordance with an embodiment. The first version of the circuit design (e.g., gate-level description 610 of FIG. 6) may include clocked storage circuits such as registers 710, 720, and 730, and register 750 that is assigned to being implemented by a pipelined routing resource 750 configured in pipeline register mode. The first version of the circuit design may further include combinational logic 740 and 760.

Combinational logic 740 and 760 may include any digital logic that is implemented by Boolean circuits, whose outputs may asynchronously change as a function of only the present inputs. Examples of combinational logic may include AND, OR, NAND, NOR, and XOR logic gates, inverters, pass gates, multiplexers, demultiplexers, look-up tables, logic arrays, etc. and any combination thereof.

In contrast, sequential logic may include any digital logic that is implemented by circuits, whose outputs may synchronously change at discrete times in response to a synchronization signal (e.g., a clock signal). Examples of sequential logic may include any clocked storage circuits such as registers or memories such as random-access memory (RAM), read-only memory (ROM), content-addressable memory (CAM), etc.

A circuit design element may include any combinational logic and/or sequential logic and/or wire in a circuit design. If desired, a delay may be associated with a circuit design element.

In the example of FIG. 7, register 710 may send a signal to register 720; register 720 may send the signal to register 730; register 730 may send the signal through combinational logic 740 to register 750 implemented in a pipelined routing resource; and register 750 may send the signal through combinational logic 760.

Consider the scenario in which tools 576 of FIG. 5 anticipate that register 720 may move during register retiming operations (e.g., along a wire between registers 710 and 730). As an example, placement 612 of FIG. 6 may invoke timing analysis 614 which may determine that the delay from register 710 to register 720 and the delay from register 720 to register 730 are unbalanced (e.g., the delay from register 710 to register 720 is significantly greater than the delay from register 720 to register 730 or vice versa).

In this scenario, a depopulation operation may eliminate register 720 from the first version of the circuit design for the purpose of subsequent operations (e.g., placement and routing operations). For example, the depopulation operation may connect the output of register 710 directly to the input of register 730 and remove register 720 from the circuit design. Alternatively, the depopulation operation may label register 720 to prevent subsequent operations such as placement and routing operations from placing register 720 and/or connecting register 720.

If desired, a constraint generation operation may generate a constraint that informs subsequent operations such as placement and routing operations to reserve a register along the path from register 710 to register 730. For example, the constraint generation operation may generate constraint 725. Based on constraint 725, tools 576 of FIG. 5 may perform placement operations that place registers 710 and 730 such that the routing operations may insert at least one pipelined routing resource such as pipelined routing resource 300 of FIG. 3 between registers 710 and 730.

In some embodiments, register 306 of pipelined routing resource 300 (see FIG. 3) may include fewer features than register 720. For example, register 720 may include a clock enable circuit, a synchronous clear circuit, an asynchronous clear circuit, a preset circuit, just to name a few, while register 306 may include none or only a selected few of these features.

As an example, consider the scenario in which register 720 has a clock enable circuit, which register 306 lacks. Consider further that, after routing the connection between registers 710 and 730, a pipelined routing resource operating in pipeline register mode (e.g., register 306 in pipelined routing resource 300 of FIG. 3) implements register 720. In this example, the depopulation operation may generate clock enable circuitry and insert the clock enable circuitry in the circuit design. Tools 576 of FIG. 5 may place and route the inserted clock enable circuitry.

Similarly, the depopulation operation may implement any other feature that register 720 has and register 306 lacks in additional circuitry and insert the additional circuitry into the circuit design. Tools 576 of FIG. 5 may place and route the additional circuitry.

In some embodiments, the depopulation operation may select which registers to eliminate according to predetermined criteria. For example, the depopulation operation may eliminate registers that use the same feature set as the registers that are available in registers 306, may eliminate registers that have a predetermined feature difference with registers 306, n may eliminate registers independent of the feature difference with registers 306, etc.

If desired, the depopulation operation may avoid eliminating certain registers such as registers that have a predetermined user assignment, registers that have certain features (e.g., asynchronous reset circuitry), registers that are on the border of clock domains (i.e., registers that are clocked by a first clock and coupled to registers that are clocked by a second clock which is different than the first clock), just to name a few.

In some embodiments, the depopulation operation may execute according to an effort level. As an example, a user may define an effort level using design and constraint entry tools 564 of FIG. 5. For example, the user may select an effort level that is based on the number of registers to depopulate (e.g., as a percentage of the total number in the design), based on an estimated timing improvement, based on estimated routing congestion (e.g., leading to longer paths and thus worse delay than anticipated), based on the risk of a no-fit (e.g., subsequent repopulation operations are unable to find a legal solution), based on a trade-off between the estimated timing improvement and the risk of a no-fit, etc.

If desired, tools 576 may include a default effort level. For example, the default effort level may define a percentage of registers to depopulate, be tied to the predetermined criteria (e.g., only depopulate registers that have the same feature set as registers in pipelined routing resources), be tied to estimated timing improvement (e.g., stop the repopulation operation when the estimated timing improvement exceeds the timing constraints by 10%), be tied to an estimated routing congestion, or a combination thereof, just to name a few.

The effort level may be predetermined, adaptive, or a combination thereof. For example, the effort level may have an initial setting, which may be predetermined and which the depopulation operation may modify based on the risk of a no-fit, estimated timing improvements, etc.

The depopulation operation may select the order in which registers are eliminated according to a predetermined priority. The predetermined priority may be based on user settings. For example, a user may define the order using design and constraint entry tools 564 of FIG. 5. If desired, tools 576 may include a default priority. The default priority may be based on the feature set of the registers, timing information (e.g., obtained during timing analysis 614 of FIG. 6), available resources, etc.

The predetermined priority and the predetermined criteria of the depopulation operation may be provided for individual data paths, portions of individual data paths, portions of a design, or for the entire design. For example, the predetermined priority and the predetermined criteria of the depopulation operation may be provided with the design specification 602, the RTL description 606 (e.g., as a pragma or as an assertion), in a constraint file, or through user input (e.g., using the design and constraint entry tools 564 of FIG. 5), just to name a few.

In certain embodiments, a given portion of the circuit design may have conflicting criteria and/or conflicting priorities for register elimination, e.g., a first criterion received with the behavioral design specification may conflict with a second criterion received with a constraint file. In this scenario, a predetermined priority for applying the criteria, which may be defined explicitly or resolved implicitly by CAD tools 520, may determine which of the conflicting criteria is selected. For example, the criterion from the user or a configuration file may override the criteria received from other sources, and a criterion received with the RTL description may override a criterion received with the behavioral design specification.

Figure 8:
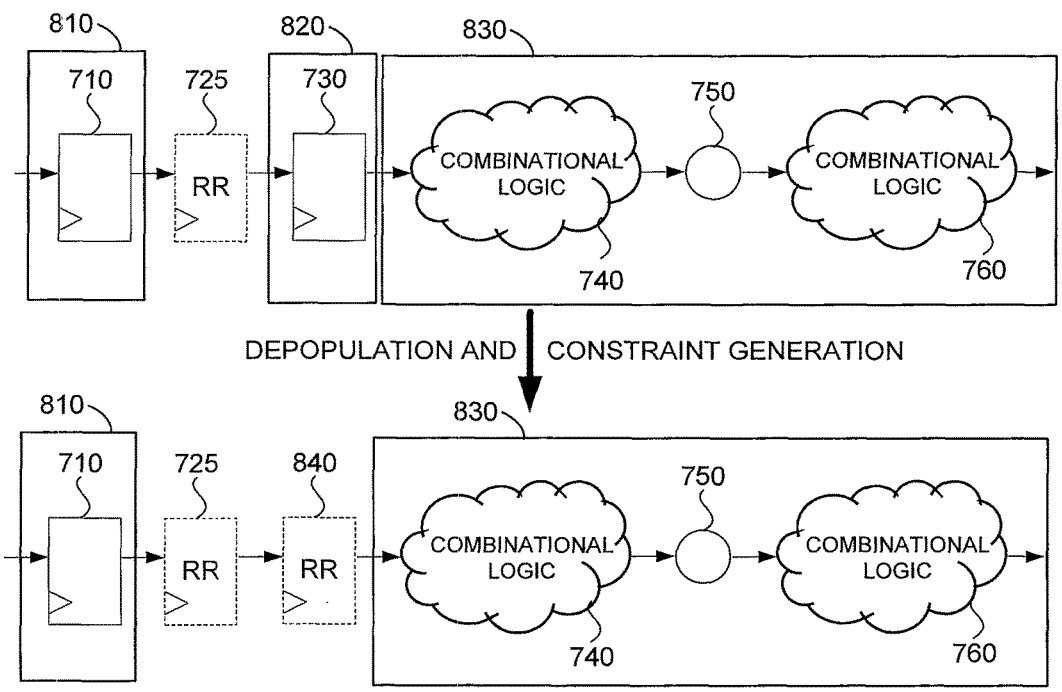
FIG. 8 is a diagram of an illustrative depopulation and constraint generation operation after placement operations in accordance with an embodiment.

During step 621 of FIG. 6, depopulation operations and constraint generation may be performed before routing (e.g., on placed gate-level description 613). FIG. 8 shows an illustrative depopulation and constraint generation operation before routing operations in accordance with an embodiment.

The first version of the placed circuit design in FIG. 8 may include constraint 725 and the placed circuit design elements of FIG. 7 such as register 710 assigned to be placed in location 810 on the integrated circuit, register 730 assigned to be placed in location 820, and register 750 that is assigned to being implemented by a pipelined routing resource 750 configured in pipeline register mode. The first version of the placed circuit design may further include combinational logic 740 and 760. Combinational logic 740 and 760 and pipelined routing resource 750 may have an assignment that places them in location 830 on the integrated circuit.

Consider the scenario in which tools 576 of FIG. 5 anticipate that register 730 which is placed in location 820 may move during register retiming operations (e.g., along a wire between registers 710 and combinational logic 740). In this scenario, a depopulation operation may eliminate register 730 and the assignment of register 730 to location 820 from the first version of the circuit design for the purpose of subsequent operations (e.g., routing operations). For example, the depopulation operation may connect the output of register 710 directly to the input of combinational logic 740 and remove register 730 from the circuit design. Alternatively, the depopulation operation may label register 730 to prevent that subsequent operations such as routing operations connect register 730.

If desired, a constraint generation operation may generate a constraint that informs subsequent operations such as the routing operations to reserve a register along the path from register 710 to combinational logic 740. For example, the constraint generation operation may generate constraint 840. Based on constraints 725 and 840, tools 576 of FIG. 5 may perform routing operations that insert at least two pipelined routing resources such as pipelined routing resource 300 of FIG. 3 between registers 710 and combinational logic 740.

Figure 9:
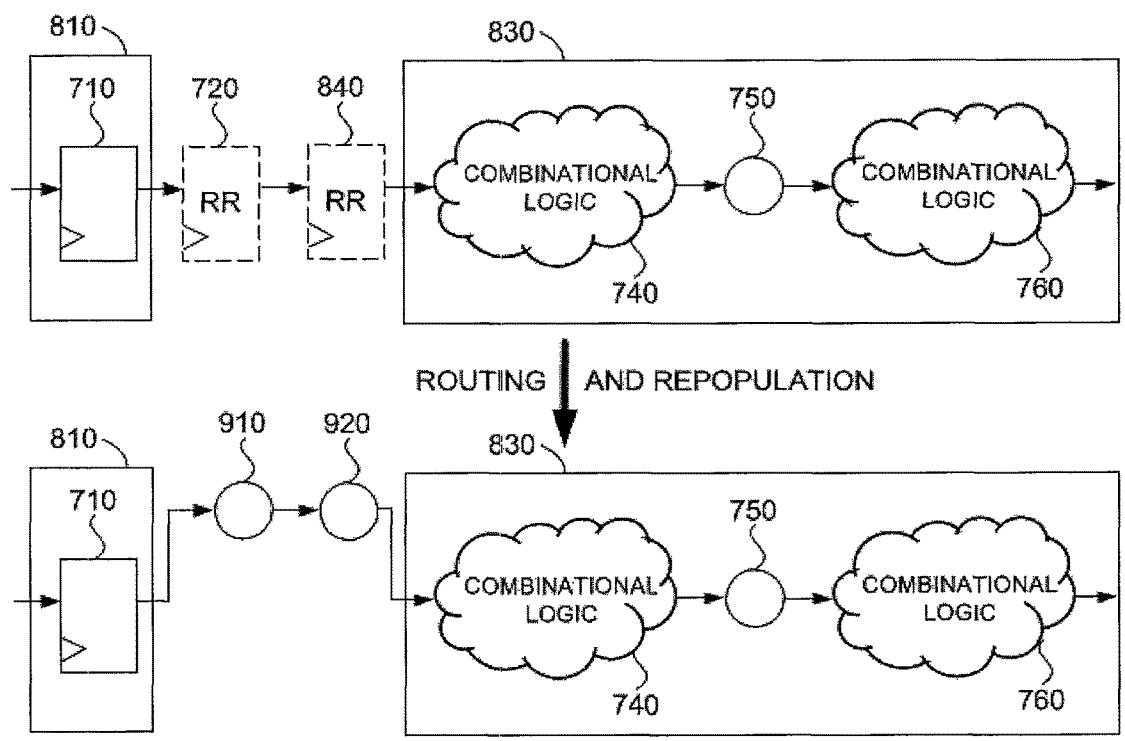
FIG. 9 is a diagram of an illustrative routing and repopulation operation in accordance with an embodiment.

FIG. 9 shows an illustrative routing and repopulation operation in accordance with an embodiment. The first version of the placed circuit design in FIG. 9 may include constraints 725 and 840 and the placed circuit design elements of FIG. 8 such as register 710 assigned to be placed in location 810 on the integrated circuit, register 730 assigned to be placed in location 820, as well as combinational logic 740 and 760 that are assigned to be placed in location 830 on the integrated circuit together with register 750 that is assigned to being implemented by a pipelined routing resource 750 configured in pipeline register mode.

During routing operations, tools 576 of FIG. 5 may connect the circuit design elements assigned to be placed in locations 810 and 830, respectively. For example, tools 576 may connect register 710 and combinational logic 740 with two pipelined routing resources 910 and 920 based on constraints 720 and 840. If desired, the pipelined routing resources may be configured in non-pipelined mode.

Repopulation operations may reinsert registers between register 710 and combinational logic 740 based on constraints 720 and 840. As an example, the repopulation operation may change the configuration of the pipelined routing resources 910 and 920 from operating in non-pipeline mode to operating in pipeline register mode.

Figure 10:
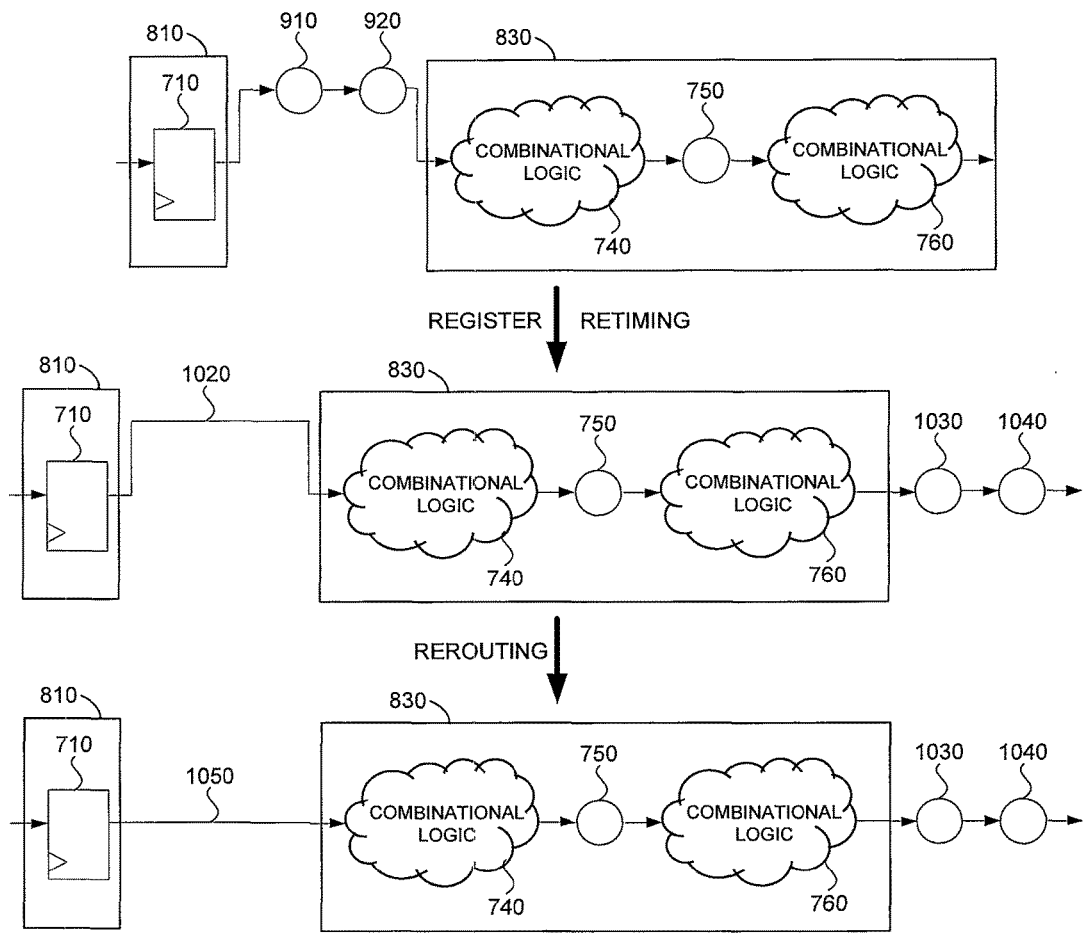
FIG. 10 is a diagram of an illustrative register retiming and rerouting operations in accordance with an embodiment.

If desired, tools 576 of FIG. 5 may perform register retiming operations after routing on routed gate-level description 617 (e.g., as described in step register retiming 619 of FIG. 6). FIG. 10 shows an illustrative register retiming and rerouting operation in accordance with an embodiment. The first version of the routed circuit design in FIG. 10 may include the placed and routed circuit design elements of FIG. 9 such as register 710 assigned to be placed in location 810 on the integrated circuit, as well as combinational logic 740 and 760 that are assigned to be placed in location 830 on the integrated circuit together with register 750 that is assigned to being implemented by a pipelined routing resource 750 configured in pipeline register mode. Pipelined routing resources 910 and 920 may connect register 710 to combinational logic 740.

During register retiming operations, tools 576 of FIG. 5 may move the registers from the input of combinational logic 740 to the output of combinational logic 760. As an example, tools 576 may perform the register retiming operation by changing the configuration of the pipelined routing resources 910 and 920 from operating in pipeline register mode to operating in non-pipeline mode and changing the configuration of the pipelined routing resources 1030 and 1040 from operating in non-pipeline mode to operating in pipeline register mode, thereby creating the second version of the circuit design shown in FIG. 10.

As a result, connection 1020 between register 710 and combinational logic 740 no longer requires pipelined routing resources. If desired, a rerouting operation may generate a new connection 1050 between register 710 and combinational logic 740. Connection 1050 may reduce the delay between location 810 and 830 relative to connection 1020 as illustrated in the third version of the circuit design in FIG. 10.

Figure 11:
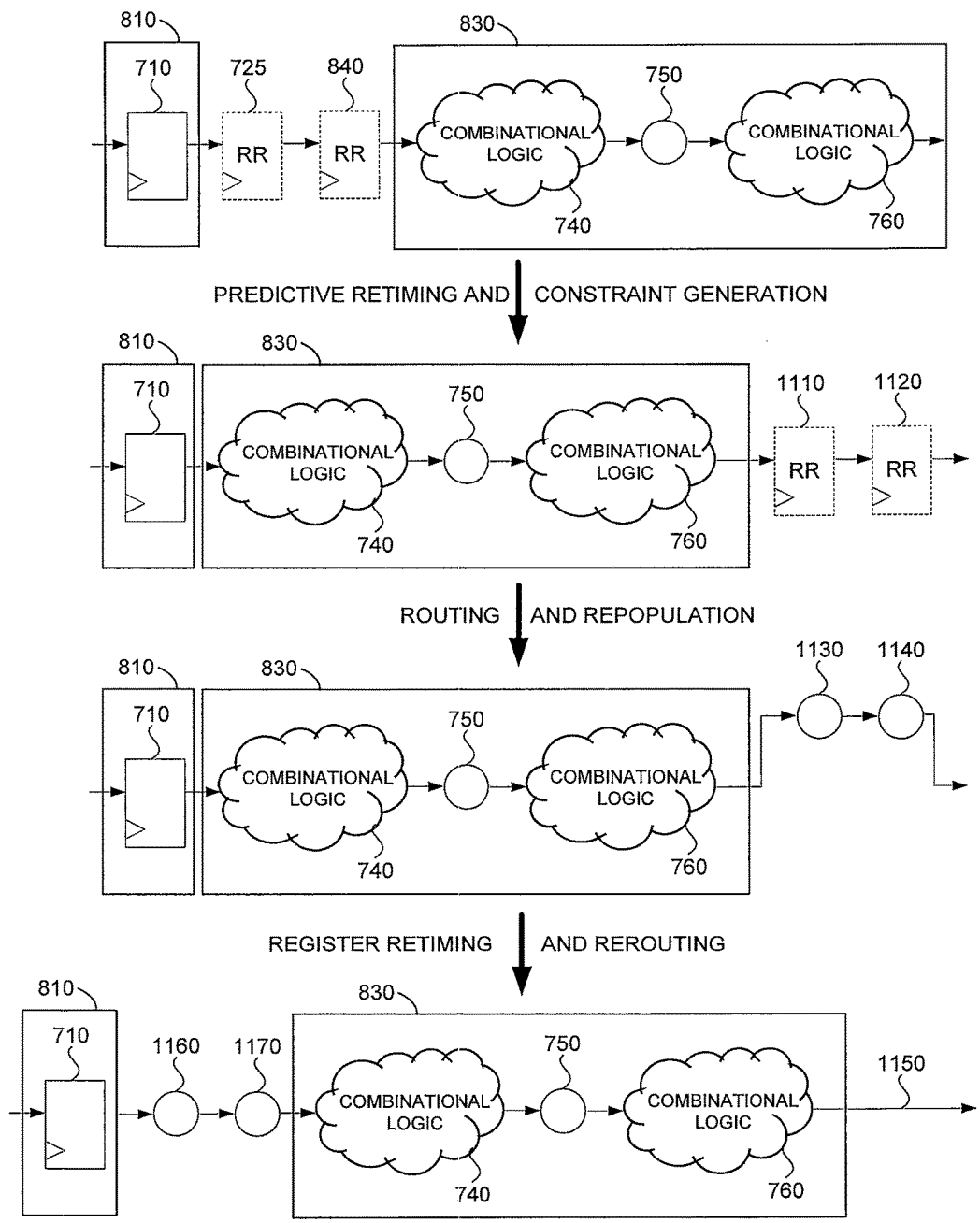
FIG. 11 is a diagram of an illustrative predictive retiming and constraint generation operation followed by routing and repopulation operations and register retiming and rerouting operations in accordance with an embodiment.

In some embodiments, tools 576 may anticipate the register retiming operation by performing a predictive retiming operation in which the generated constraints are moved before placement and/or before routing. FIG. 11 shows an illustrative predictive retiming and constraint generation before routing in accordance with an embodiment.

As shown, the first version of the placed circuit design in FIG. 11 may include constraints 725 and 840 and the placed circuit design elements of FIG. 8 such as register 710 assigned to be placed in location 810 on the integrated circuit, register 730 assigned to be placed in location 820, as well as combinational logic 740 and 760 that are assigned to be placed in location 830 on the integrated circuit together with register 750 that is assigned to being implemented by a pipelined routing resource 750 configured in pipeline register mode.

During predictive retiming and constraint generation operations, tools 576 of FIG. 5 may move constraints 725 and 840 from the input of combinational logic 740 to the output of combinational logic 760. For example, tools 576 may remove constraints 725 and 840 and generate new constraints 1110 and 1120 as shown in the second version of the circuit design in FIG. 11.

Routing operations may connect the circuit design elements placed in location 810 with the circuit design elements placed in location 830. Routing and repopulation operations may further route the output of combinational logic 760 through two registers based on constraints 1110 and 1120. As an example, routing operations may connect the output of combinational logic 760 to pipelined routing resources 1130 and 1140; and repopulation operations may configure pipelined routing resources 1130 and 1140 to operate in pipeline register mode.

If desired, tools 576 may perform register retiming and rerouting operations after routing and repopulation operations. For example, consider the scenario in which the critical path in the third version of the circuit design of FIG. 11 is from register 710 through combinational logic 740 to the register in pipelined routing resource 750. As shown, in this scenario, register retiming operations may move two registers from the output of combinational logic 760 to the input of combinational logic 740. As an example, tools 576 may perform the register retiming operation by changing the configuration of the pipelined routing resources 1130 and 1140 from operating in pipeline register mode to operating in non-pipeline mode and changing the configuration of the pipelined routing resources 1160 and 1170 from operating in non-pipeline mode to operating in pipeline register mode.

As a result, the connection at the output of combinational logic 760 no longer requires pipelined routing resources. If desired, a rerouting operation may generate a new connection 1150 at the output of combinational logic 760 as illustrated in the third version of the circuit design shown in FIG. 11.

Figure 12:
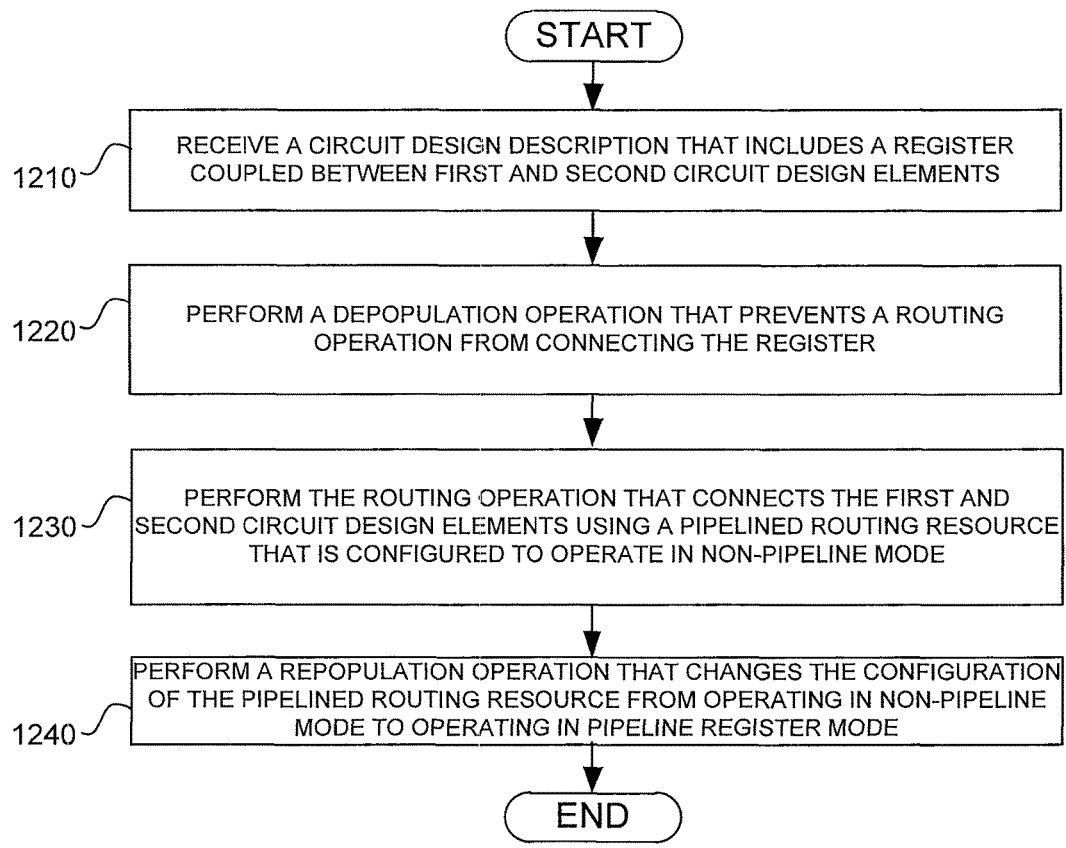
FIG. 12 is a flow chart of illustrative steps for performing depopulation, routing, and repopulation operations in accordance with an embodiment.

FIG. 12 is a flow chart showing illustrative steps that circuit design computing equipment such as tools 576 of FIG. 5 may perform during depopulation, routing, and repopulation operations in accordance with an embodiment. During step 1210, the circuit design computing equipment may receive a circuit design description that includes a register coupled between first and second circuit design elements.

During step 1220, the circuit design computing equipment may perform a depopulation operation that prevents a routing operation from connecting the register. For example, the circuit design computing equipment may perform a depopulation operation on the first version of the circuit design description of FIG. 8, whereby register 730 that is placed in location 820 remains unconnected by a subsequent routing operation.

During step 1230, the circuit design computing equipment may perform the routing operation that connects the first and second circuit design elements using a pipelined routing resource that is configured to operate in non-pipeline mode. For example, the circuit design computing equipment may connect register 710 and combinational logic 740 using pipelined routing resources 910 and 920 as shown in FIG. 9.

During step 1240, the circuit design computing equipment may perform a repopulation operation that changes the configuration of the pipelined routing resource from operating in non-pipeline mode to operating in pipeline register mode. As an example, the circuit design computing equipment may change the configuration of pipelined routing resource 920 of FIG. 9 from operating in non-pipeline mode to operating in pipeline register mode during a repopulation operation.

Figure 13:
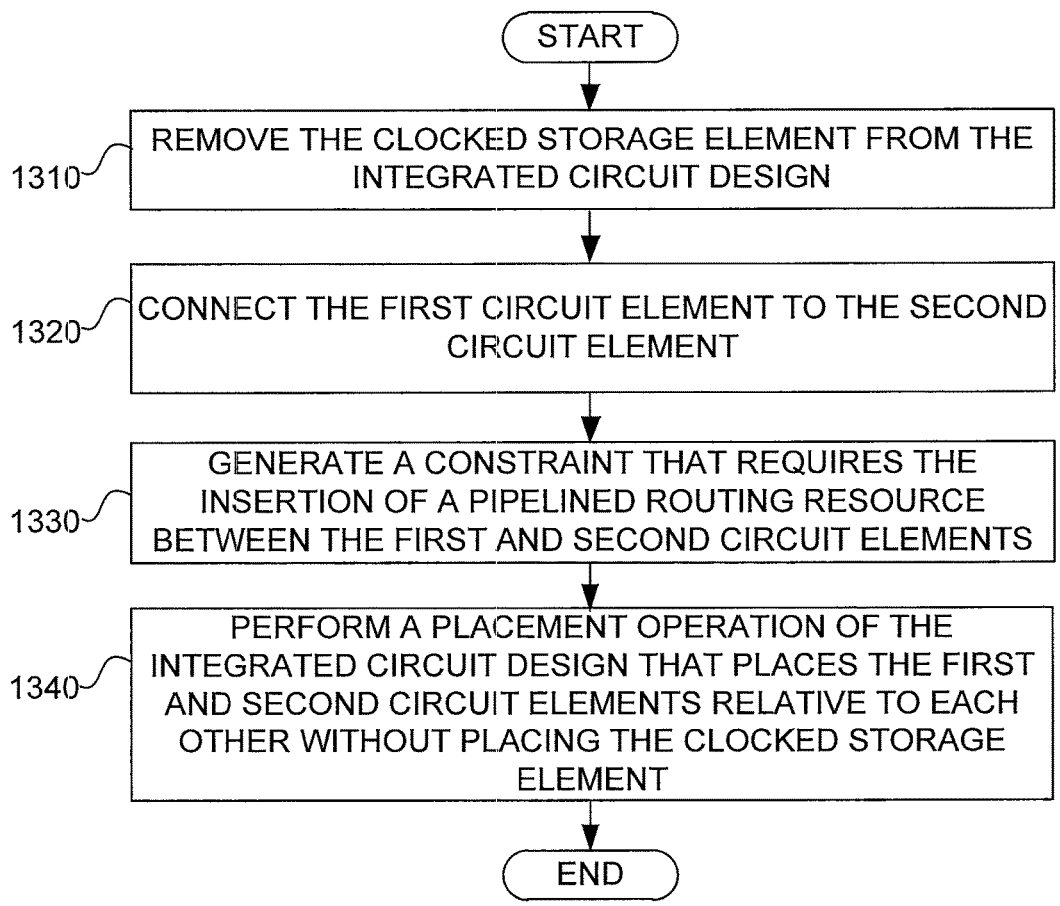
FIG. 13 is a flow chart of illustrative steps for eliminating a clocked storage element from an integrated circuit design prior to performing a placement operation in accordance with an embodiment.

FIG. 13 is a flow chart showing illustrative steps that a CAD tool may perform when eliminating a clocked storage element from an integrated circuit design prior to performing a placement operation in accordance with an embodiment. During step 1310, the CAD tool may remove the clocked storage element from the integrated circuit design. As an example, the CAD tool may remove register 720 of the circuit design shown in FIG. 7.

During step 1320, the CAD tool may connect the first circuit element to the second circuit element and generate a constraint that requires the insertion of a pipelined routing resource between the first and second circuit elements during step 1330. As an example, the CAD tool may connect the output of register 710 to the input of register 730 of FIG. 7 and generate constraint 725 that requires the insertion of a pipelined routing resource between registers 710 and 730.

During step 1340, the CAD tool may perform a placement operation of the integrated circuit design that places the first and second circuit elements relative to each other without placing the clocked storage element. For example, the CAD tool may generate the placement shown in the first version of FIG. 8 in which register 710 is placed in location 810, register 730 in location 820, and register 720 remains without a placement assignment.

Figure 14:
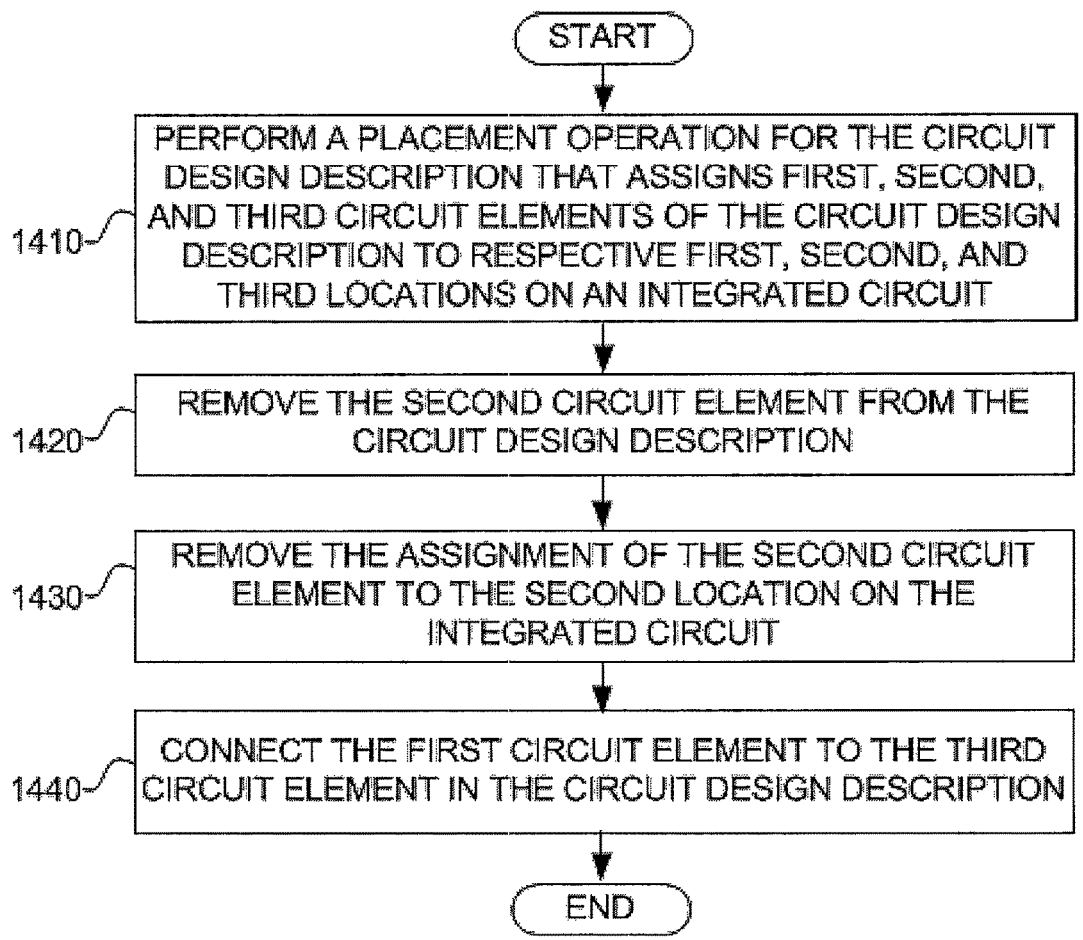
FIG. 14 is a flow chart of illustrative steps for eliminating a circuit design element from a circuit design description after a placement operation in accordance with an embodiment.

FIG. 14 is a flow chart showing illustrative steps that a CAD tool may perform for eliminating a circuit design element from a circuit design description after a placement operation. During step 1410, the CAD tool may perform a placement operation for the circuit design description that assigns first, second, and third circuit elements of the circuit design description to respective first, second, and third locations on an integrated circuit. For example, as shown in the first version of the circuit design of FIG. 8, tools 576 may place register 710 in location 810 on the integrated circuit, register 730 in location 820, and register 750 that is assigned to being implemented by a pipelined routing resource 750 configured in pipeline register mode that connects combinational logic 740 and 760 in location 830 on the integrated circuit.

During step 1420, the CAD tool may remove the second circuit element from the circuit design description; and during step 1430, the CAD tool may remove the assignment of the second circuit element to the second location on the integrated circuit. For example, the CAD tool may remove register 730 and the assignment of register 730 to location 820, thereby producing the second version of the circuit design of FIG. 8.

During step 1440, the CAD tool may connect the first circuit element to the third circuit element in the circuit design description.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of performing register retiming operations is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented in any suitable combination.

What is claimed is:

1. A method for operating circuit design computing equipment, comprising:
   with the circuit design computing equipment, receiving a circuit design description that includes a register coupled between first and second circuit design elements;
   with the circuit design computing equipment, performing a depopulation operation that removes the register; and
   with the circuit design computing equipment, performing the routing operation that connects the first circuit design element to the second circuit design element without passing through the removed register.

2. The method of claim 1, wherein the first and second circuit design elements are selected from the group consisting of combinational logic and sequential logic.

3. The method of claim 1, wherein the first and second circuit design elements are connected using a pipelined routing resource that is configured to operate in a non-pipeline mode.

4. The method of claim 3, further comprising:
   with the circuit design computing equipment, performing a repopulation operation that changes the configuration of the pipelined routing resource from operating in the non-pipeline mode to operating in a pipeline register mode.

5. The method of claim 4, further comprising:
   with the circuit design computing equipment, performing a register retiming operation that configures the pipelined routing resource to operate in the non-pipeline mode.

6. The method of claim 5, wherein performing the register retiming operation further comprises:

with the circuit design computing equipment, changing the configuration of an additional pipelined routing resource that is connected to an output of the second circuit design element from operating in the non-pipeline mode to operating in the pipeline register mode.

7. The method of claim 5, wherein performing the register retiming operation further comprises:
   with the circuit design computing equipment, changing the configuration of an additional pipelined routing resource that is connected to an input of the first circuit design element from operating in the non-pipeline mode to operating in the pipeline register mode.

8. The method of claim 1, wherein performing the depopulation operation further comprises:
   generating a constraint for the routing operation, wherein the constraint requires the routing operation to connect the first and second circuit design elements using at least one pipelined routing resource.

9. The method of claim 1, wherein the circuit design description includes an additional register coupled between third and fourth circuit design elements, further comprising:
   determining whether to perform an additional depopulation operation based on a predetermined criterion; and
   in response to determining that the additional depopulation operation is to be performed, performing the additional depopulation operation that prevents a subsequent placement operation from placing the additional register.

10. The method of claim 9, wherein the predetermined criterion is selected from the group consisting of: a feature set of the additional register, a setting associated with the additional register, an estimated routing congestion caused by the additional depopulation operation, and an estimated timing improvement thanks to the additional depopulation operation.

11. The method of claim 9, wherein the additional register has a synchronous clear input and includes logic for performing a synchronous clear operation based on a signal received at the synchronous clear input and wherein the additional depopulation operation further comprises:
   generating a fifth circuit design element that performs the synchronous clear operation; and
   coupling the fifth circuit design element between the third circuit design element, the synchronous clear input, and the fourth circuit design element.

12. The method of claim 9, wherein the additional register includes logic for performing a clock enable operation and wherein the additional depopulation operation further comprises:
   generating a fifth circuit design element that executes a clock enable operation.

13. The method of claim 9, further comprising:
   performing the placement operation that places the third and fourth circuit design elements without placing the additional register.

14. The method of claim 13, further comprising:
   with the circuit design computing equipment, performing a predictive register retiming operation that causes the subsequent routing operation to connect an output of the fourth circuit design element to a pipelined routing resource.

* * * * *